United States Patent
Brueggen (10) Patent No.: US 7,149,945 B2
(45) Date of Patent: Dec. 12, 2006

(54) SYSTEMS AND METHODS FOR PROVIDING ERROR CORRECTION CODE TESTING FUNCTIONALITY

(75) Inventor: Christopher M. Brueggen, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 620 days.

(21) Appl. No.: 10/435,149

(22) Filed: May 9, 2003

(65) Prior Publication Data

US 2004/0225943 A1    Nov. 11, 2004

(51) Int. Cl.
*H03M 13/00*    (2006.01)

(52) U.S. Cl. .................. 714/758; 714/756; 714/769; 714/784

(58) Field of Classification Search ............ 714/758, 714/769, 756, 784

See application file for complete search history.

(56) References Cited

U.S. PATENT DOCUMENTS 4,612,640 A * 9/1986 Mehrotra et al. ........... 714/766
7,103,824 B1 * 9/2006 Halford ...................... 714/759

OTHER PUBLICATIONS

U.S. Appl. No. 10/435,150, C. M. Brueggen.
Kaneda, Shigeo, et al., "Single Byte Error Correcting-Double Byte Detecting Codes for Memory Systems." IEEE Transactions on Computers, vol. C-3, No. 7, Jul. 1982, pp. 596-602.
Morelos-Zaragoza, Robert H., "The Art of Error Correcting Coding." Sony Computer Science Laboratories, Inc. Japan, pp. 33-72.

* cited by examiner

*Primary Examiner*—Guy J. Lamarre (57) ABSTRACT

In one embodiment, a memory controller comprises a cache line processing block for processing a cache line into a plurality of segments, an error correction code (ECC) generation block that forms ECC code words for each of the plurality of segments for storage in a plurality of memory components, an ECC correction block for correcting at least one single-byte erasure error in each erasure corrupted ECC code word retrieved from the plurality of memory components, and an error seeding block that enables a respective error to be inserted into each ECC code word of the cache line in response to a plurality of error registers.

20 Claims, 7 Drawing Sheets

SYSTEMS AND METHODS FOR PROVIDING ERROR CORRECTION CODE TESTING FUNCTIONALITY

RELATED APPLICATIONS

This application is related to concurrently filed and commonly assigned U.S. patent application Ser. No. 10/435,150, entitled "SYSTEMS AND METHODS FOR PROCESSING AN ERROR CORRECTION CODE WORD FOR STORAGE IN A PLURALITY OF MEMORY COMPONENTS," which is incorporated herein by reference which patent application has been abandoned.

FIELD OF THE INVENTION

The present invention is related to implementation of error correction code testing functionality in a memory controller for a memory system.

DESCRIPTION OF RELATED ART

Electronic data storage utilizing commonly available memories (such as dynamic random access memory (DRAM)) can be problematic. Specifically, there is a probability that, when data is stored in memory and subsequently retrieved, the retrieved data will suffer some corruption. For example, DRAM stores information in relatively small capacitors that may suffer a transient corruption due to a variety of mechanisms. Additionally, data corruption may occur as the result of a hardware failure such as a loose memory module, blown chip, wiring defect, and/or the like. This type of data corruption is referred to as a repeatable error, since the same physical mechanism repeatedly causes the same pattern of data corruption.

To address this problem, a variety of error correction algorithms have been developed that attempt to recover corrupted data. Error correction code (ECC) algorithms operate by calculating redundant data when payload data is received. When the payload data is stored, the redundant data is stored in association with the payload data. When the payload data and the redundant data are subsequently retrieved, the redundant data is recalculated and compared to the retrieved redundant data. When an error is detected (i.e. the retrieved and recalculated redundant data do not match), the retrieved and recalculated redundant data may be used to correct certain categories of errors. An example of a known ECC scheme is described in "Single Byte Error Correcting-Double Byte Error Detecting Codes for Memory Systems" by Shigeo Kaneda and Eiji Fujiwara, published in IEEE TRANSACTIONS on COMPUTERS, Vol. C31, No. 7, July 1982.

A variety of mechanisms have been utilized in an attempt to ensure that the contemplated ECC algorithms are properly implemented when the ECC algorithms are embedded in hardware. In general, the implementation of an ECC algorithm in hardware may be modeled in software. Various errors may be manually inserted into stored data. The intentionally corrupted data may be provided to a suitable software model to determine whether the ECC algorithm properly corrects the data corruption. This approach assumes that the software model accurately models the eventual implementation in hardware. This assumption may be correct for relatively simple implementations. However, this assumption is not necessarily true for more complex designs because the equivalency of the hardware and software models is difficult to enforce, and/or the software modeling may not allow thorough testing of the ECC algorithm because of performance limitations. Thus, software modeling cannot provide a rigorous validation for all applications. Also, a method for verifying the algorithm in hardware is desired, in order to discover possible manufacturing defects or errors in the hardware synthesis process.

In a previous hardware validation method, designed to validate a single-bit or double-adjacent-bit error correcting scheme based on 144-bit ECC code words (132 bits payload, 12 bits redundancy), the validation occurs in real-time during the operation of a memory controller that corrects single-bit or double-adjacent-bit errors. Specifically, a logical block of the memory controller has been developed that resides in the read pathway from memory and inserts either single-bit errors or adjacent-double-bit errors into ECC code words processed by the memory controller. The logic block of the memory controller includes a plural number of counters to cause the bit errors to be pseudo-randomly placed within the code words. By activating the pseudo-random insertion of errors and by examining data received from the memory controller, the single-bit/double-adjacent-bit error correction scheme may be validated. In addition, another logic block has been developed that resides in the write pathway to memory and inserts nibble errors in up to two nibble locations in one or more of the eight ECC code words in a cache line, with a single cache line specified for error insertion by setting a register to the DRAM address of that cache line.

BRIEF SUMMARY OF THE INVENTION

In one embodiment, a memory controller comprises a cache line processing block for processing a cache line into a plurality of segments, an error correction code (ECC) generation block that forms ECC code words for each of the plurality of segments for storage in a plurality of memory components, an ECC correction block for correcting at least one single-byte erasure error in each erasure corrupted ECC code word retrieved from the plurality of memory components, and an error seeding block that enables a respective error to be inserted into each ECC code word of the cache line in response to a plurality of error registers.

DETAILED DESCRIPTION

Representative embodiments advantageously implement a validation mechanism for a byte error correction ECC algorithm within a memory system. The validation mechanism may be embedded in a memory controller for a distributed shared memory architecture. By embedding the validation mechanism in the controller, the error correction functionality may be validated in real time as data is written to and retrieved from the memory system. Specifically, according to user-controlled registers of the memory controller, errors may be selectively inserted into cache lines to be stored in memory. When the cache lines are retrieved from memory, the ECC algorithm implemented in the memory controller may attempt to correct the inserted errors. By analyzing whether the errors are properly corrected, the ECC algorithm may be validated.

Representative embodiments differ from known ECC validation hardware mechanisms because representative embodiments enable a more robust ECC algorithm to be validated. Specifically, representative embodiments enable the capability of an ECC algorithm to correct erasure errors to be validated as will be discussed in greater detail below. Moreover, representative embodiments may validate the erasure-correcting capability of the memory controller to adapt to various failures, such as the failure of a DRAM component, the failure of a wire on a DRAM bus, or the like, without causing the failure of the memory system. Representative embodiments may also utilize a validation mechanism to insert errors into particular subsets of the DRAM components or into specific cache lines. Representative embodiments may further utilize a register within the memory controller to signal when an error has been written to physical memory to facilitate to validation process. Representative embodiments may enable a user to specify the specific location and error value to be inserted into ECC code words to further increase the robustness of the validation process.

Representative embodiments may validate, for example, an implementation of a Reed-Solomon burst error correction code that performs byte correction. In Reed-Solomon algorithms, the code word consists of n m-bit numbers: $C=(c_{n-1}, c_{n-2}, \ldots, c_o)$. The code word may be represented mathematically by the following polynomial of degree n with the coefficients (symbols) being elements in the finite Galios field ($2^m$): $C(x)=(c_{n-1}x^{n-1}+c_{n-2}x^{n-2} \ldots +c_o)$. The code word is generated utilizing a generator polynomial (typically denoted by g(x)). Specifically, the payload data (denoted by u(x)) is multiplied by the generator polynomial, i.e., $C(x)=x^{n-k}u(x)+[x^{n-k}u(x)\bmod(g(x))]$ for systematic coding. Systematic coding causes the original payload bits to appear explicitly in defined positions of the code word. The original payload bits are represented by $x^{n-k}u(x)$ and the redundancy information is represented by $[x^{n-k}u(x)\bmod(g(x))]$.

When the code word is subsequently retrieved from memory, the retrieved code word may suffer data corruption due to a transient failure and/or a repeatable failure. The retrieved code word is represented by the polynomial r(x). If r(x) includes data corruption, r(x) differs from C(x) by an error signal e(x). The redundancy information is recalculated from the retrieved code word. The original redundancy information as stored in memory and the newly calculated redundancy information are combined utilizing an exclusive-or (XOR) operation to form the syndrome polynomial s(x). The syndrome polynomial is also related to the error signal. Using this relationship, several algorithms may determine the error signal and thus correct the errors in the corrupted data represented by r(x). These techniques include error-locator polynomial determination, root finding for determining the positions of error(s), and error value determination for determining the correct bit-pattern of the error(s). For additional details related to recovery of the error signal e(x) from the syndrome s(x) according to Reed-Solomon burst error correction codes, the reader is referred to THE ART OF ERROR CORRECTING CODES by Robert H. Morelos-Zaragoza, pages 33–72 (2002), which is incorporated herein by reference.

Erasures in error correction codes are specific bits or specific strings of bits that are known to be corrupted without resort to the ECC functionality. For example, specific bits may be identified as being corrupted due to a hardware failure such as a malfunctioning DRAM component, a wire defect, and/or the like. Introduction of erasures into the ECC algorithm is advantageous, because the positions of the erased bits are known. Let d represent the minimum distance of a code, v represent the number of errors, and µ represent the number of erasures contained in a received ECC code word. Then, the minimum Hamming distance between code words is reduced to at least d–µ in the non-erased portions. It follows that the error-correcting capability is [(d–µ–1)/2] and the following relation is maintained: d>2v +µ. Specifically, this inequality demonstrates that for a fixed minimum distance, it is twice as "easy" to correct an erasure as it is to correct a randomly positioned error.

In representative embodiments, the ECC algorithm of a memory controller may implement the decoding procedure of a [36, 33, 4] shortened narrow-sense Reed-Solomon code (where the code word length is 36 symbols, the payload length is 33 symbols, and the Hamming distance is 4 bits) over the finite Galios field ($2^8$). The finite Galios field defines the symbol length to be 8 bits. By adapting the ECC algorithm in this manner, the ECC algorithm may operate in two distinct modes. In a first mode, the ECC algorithm may perform "single-byte error" correction in which the term single-byte refers to 8 contiguous bits aligned to 8-bit boundaries. A single-byte error refers to any number of bits within a single-byte that are corrupted. Errors that cause bit corruption in more than one byte location are referred to as "multiple-byte errors" which are detected as being uncorrectable. In the second mode (the erasure mode), a byte location is specified in the ECC code word as an erasure via a register setting. The location may be identified by a software or firmware process as a repeatable error due to a hardware failure. Because the location of the error is known, in the erasure mode, the ECC algorithm can correct the byte error associated with the erasure and one other single-byte error.

Figure 1:
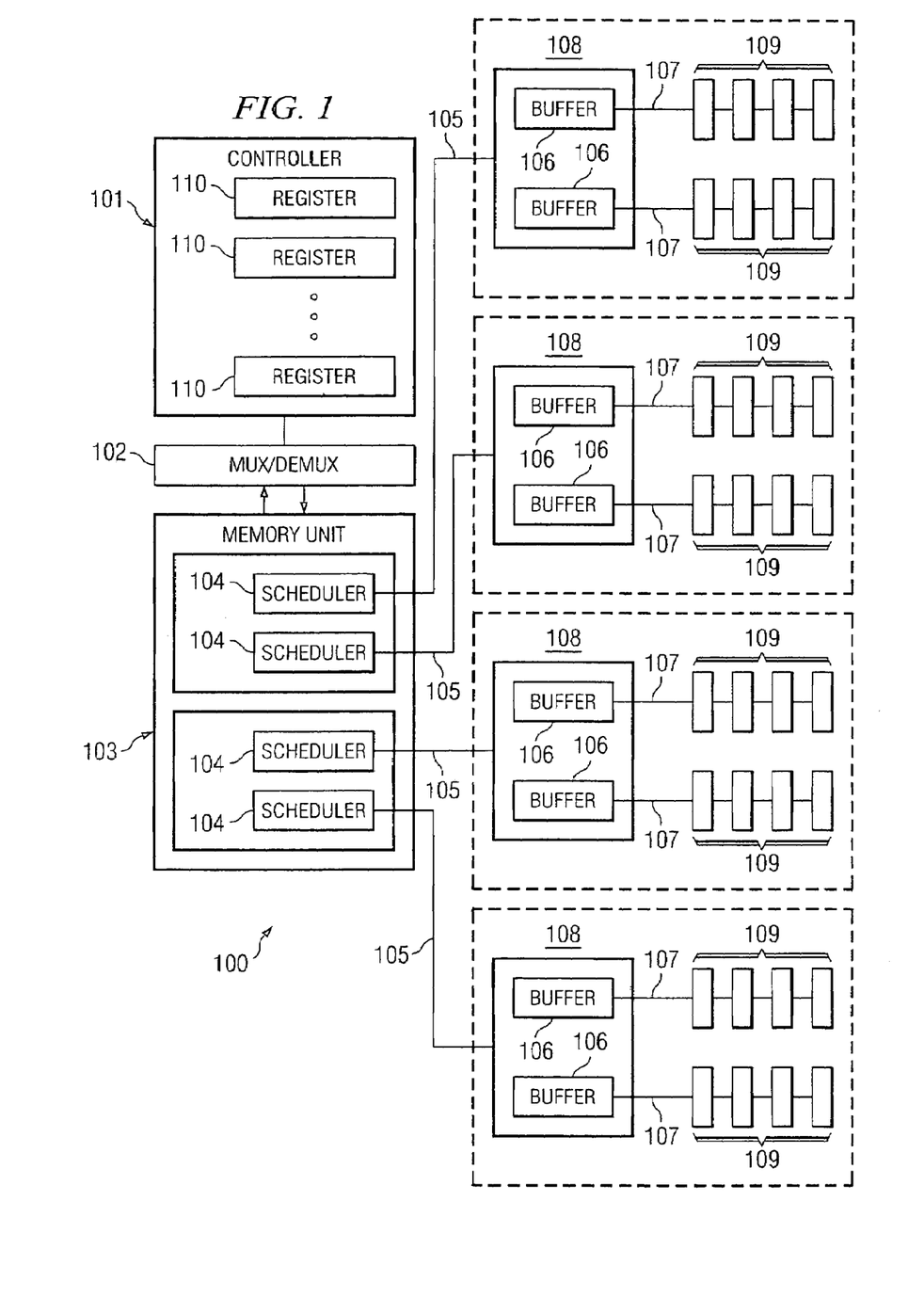
FIG. 1 depicts a memory system that implements an ECC algorithm that may be validated by representative embodiments.

Representative embodiments may validate the error correcting functionality of a memory controller system such as the systems disclosed in U.S. patent application Ser. No. 10/435,150 entitled "SYSTEMS AND METHODS FOR PROCESSING AN ERROR CORRECTION CODE WORD FOR STORAGE IN A PLURALITY OF MEMORY COMPONENTS." FIG. 1 depicts system 100 in which representative embodiment may provide a ECC validation mechanism. Controller 101 as shown in FIG. 1 may store and retrieve cache data for cache lines received from processors (not shown) in a distributed shared memory architecture. Controller 101 may utilize an ECC algorithm, such as the [36, 33, 4] shortened narrow-sense Reed-Solomon code, to perform byte-correction. When this Reed-Solomon code is utilized, the code word length is 288 bits. The error correcting functionality of controller 101 may implement an ECC algorithm utilizing standard logic designs. Specifically, the ECC functionality of controller 101 may be implemented utilizing XOR trees, shift-registers, look-up tables, and/or other logical elements.

Controller 101 may store and retrieve data to and from memory quadrants 108. Controller 101 communicates the cache data through multiplexer/demultiplexer (MUX/DEMUX) 102 and memory unit 103. Memory unit 103 comprises a plurality of schedulers 104 to schedule access to memory quadrants 108 through quadrant buses 105. Quadrant buses 105 may be implemented utilizing a bus width of 72 bits. By utilizing a bus width of 72 bits and by suitably communicating an ECC code word in respective cycles, each single-byte of an ECC code word may be transmitted across a respective pair of wires of a respective quadrant bus 105. If wire failures associated with one of quadrant buses 105 are confined to two or less single-bytes of an ECC code word, controller 101 may compensate for the wire failure(s) by utilizing the erasure mode and identification of the attendant error pattern.

Furthermore, according to representative embodiments, each of quadrants 108 includes a pair of memory buffers 106. Each memory buffer 106 may be coupled to a respective DRAM bus 107. Also, four logical memory ranks 109 may be coupled to each DRAM bus 107. Memory ranks 109 may be implemented utilizing two double-sided dynamic random access memory (DRAM) dual in-line memory modules (DIMMs) to provide a logical rank-width of 144 bits. Also, each DRAM bus 107 may have a bus width of 144 bits. By utilizing a bus width of 144 bits and by communicating data in respective bus cycles, each single-byte of an ECC code word may be transferred across a respective set of four wires of DRAM bus 107. Thus, if any set of wire failures affects two or less single-bytes of an ECC code word, controller 101 may compensate for the wire failures by utilizing the erasure mode and identification of the attendant error pattern.

Each memory rank 109 of one embodiment includes a plurality of DRAM components (not shown) within respective DIMMs. The DRAM components may have width of 4 bits. By communicating cache data utilizing even nibbles of a code word in a first bus cycle and odd nibbles in a second bus cycle, controller 101 may cause each single-byte of an ECC code word to be stored within a single DRAM component. By doing so, controller 101 may also compensate for failures of ones of DRAM components.

Registers 110 may identify whether the erasure mode should be applied to data retrieved from a specific bank (subunit within a logical rank 109), logical rank 109, DRAM bus 107, quadrant bus 105, and/or any other suitable hardware component depending upon the architectural implementation. The capability to specify multiple independent erasures increases the probability that multiple repeatable failures in the memory system can be corrected. For example, two erasures may be specified, allowing two different repeatable errors associated with two different ranks or two different DRAM buses, etc. to be corrected.

Also, in erasure mode, a small percentage of uncorrectable errors may be decoded as correctable. The capability to specify the erasure for a limited region of the memory system reduces the probability of uncorrectable errors being misdiagnosed as correctable. For example, if a hardware error causes the corruption of a single-byte error for ECC code words communication via the "top" DRAM bus 107 of the first memory quadrant 108, one of registers 110 may be set to identify the specific byte of the ECC code word for that bus. When ECC code words are received from that DRAM bus 107, the erasure mode may be applied to those ECC code words to address the data corruption. Moreover, the application of the erasure mode to those ECC code words may be independent of the processing of ECC code words retrieved from all of the other DRAM buses 107. Accordingly, the increased probability of misdiagnosed uncorrectable errors is limited to a specific subset of the memory system.

Figure 2:
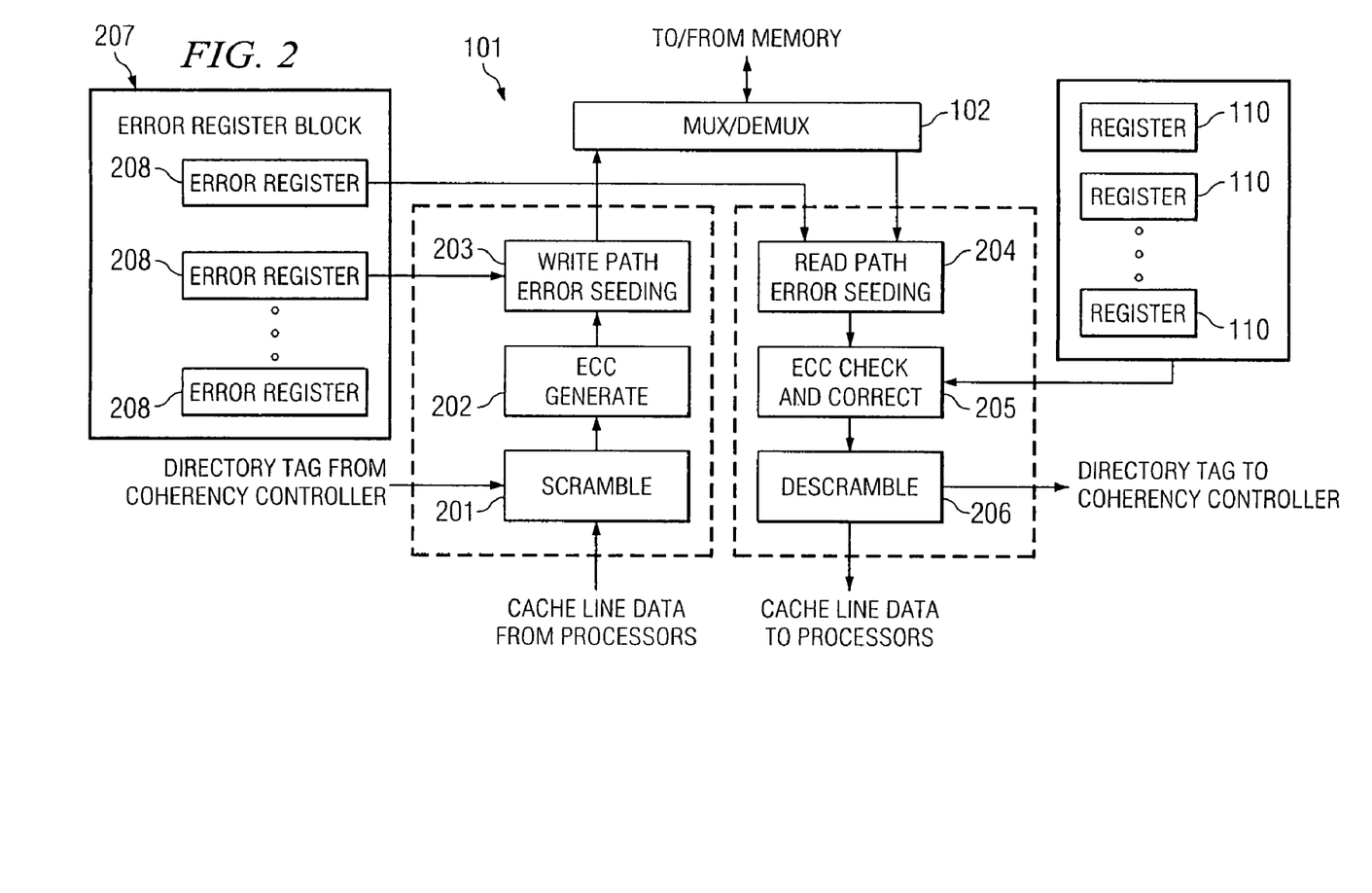
FIG. 2 depicts a memory controller that implements an ECC algorithm that may be validated by representative embodiments.

Thus, memory controller 101 enables the correction of a wide variety of error patterns generated by various combinations of hardware failures within memory system 100. FIG. 2 depicts memory controller 101, in greater detail, including error seeding functionality to facilitate validation of the robust error correction functionality implemented according to representative embodiments. When cache data is received from a processor (not shown) via a suitable interconnect, memory controller 101 may segment the cache data and associated tag data from a coherency controller (not shown) into a plurality of portions in scramble block 201. In representative embodiments, scramble block 201 may segment a cache line and associated tag data to be embedded into four ECC code words. ECC code words may be generated for the segmented cache data and tag data in ECC generate block 202. After generation of a respective ECC code word, write path error seeding block 203 may selectively insert data errors into the ECC code word depending upon the values loaded into selected error registers 208 of error register block 207. Each ECC code word with the inserted error(s) is then communicated to MUX/DEMUX 102 to be stored within a logical rank 109 of the memory.

When memory controller 101 retrieves an ECC code word from memory, read path error seeding block 204 may insert errors into the retrieved data according to selected error registers 208 of error register block 207. ECC check and correction block 205 performs error detection and correction according to the appropriate ECC algorithm. ECC check and correction block 205 may perform error correction for an ECC code word according to the two modes (single byte-correction mode and erasure mode correction) depending upon values of registers 110. Descramble block 206 reassembles the data from ECC check and correction block 205 into a cache line for communication to a processor and into tag data for communication to the coherency controller.

Figure 3A:
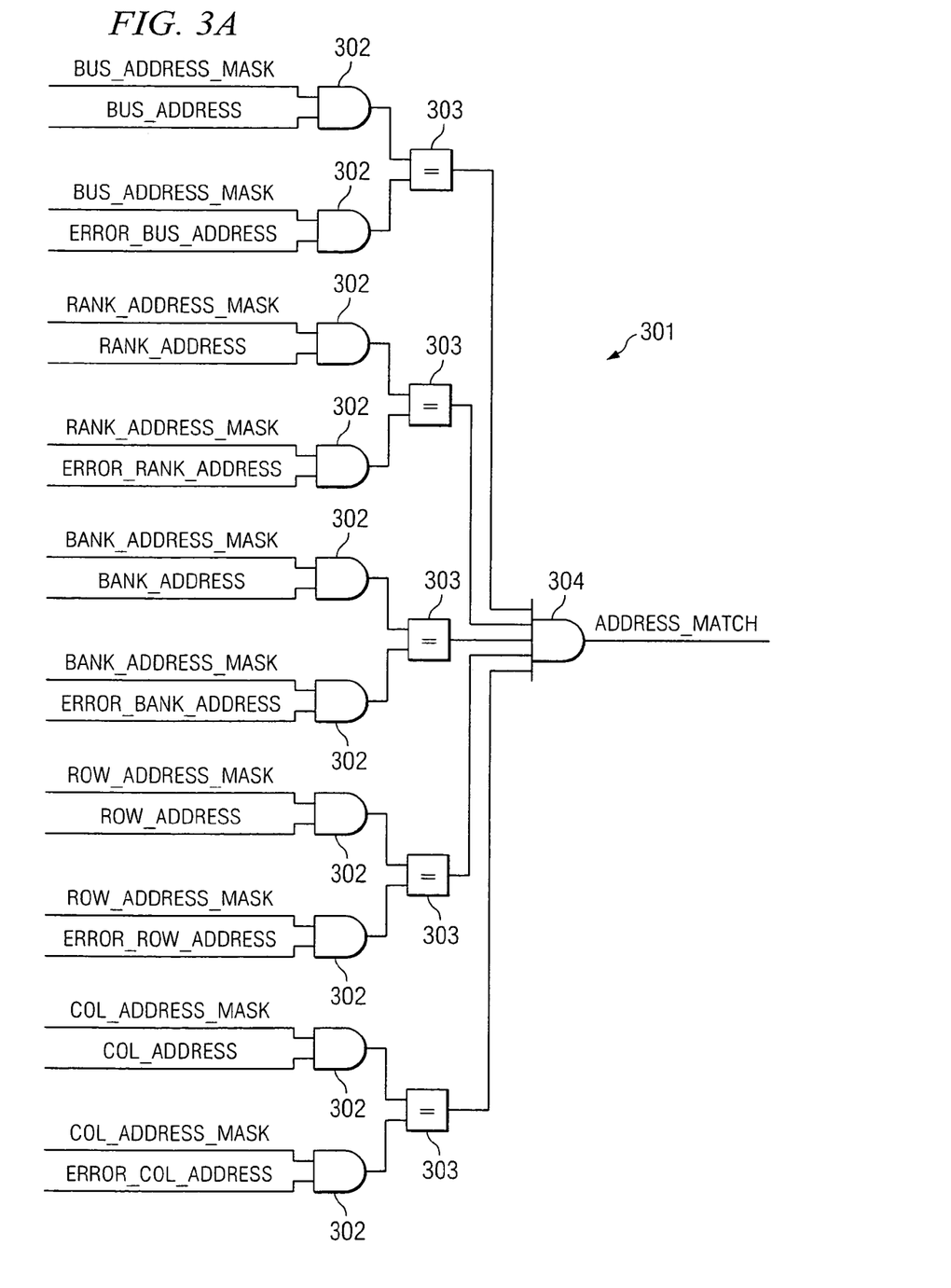
FIG. 3A depicts a logical block for limiting error seeding to identified addresses according to representative embodiments.
Figure 3B:
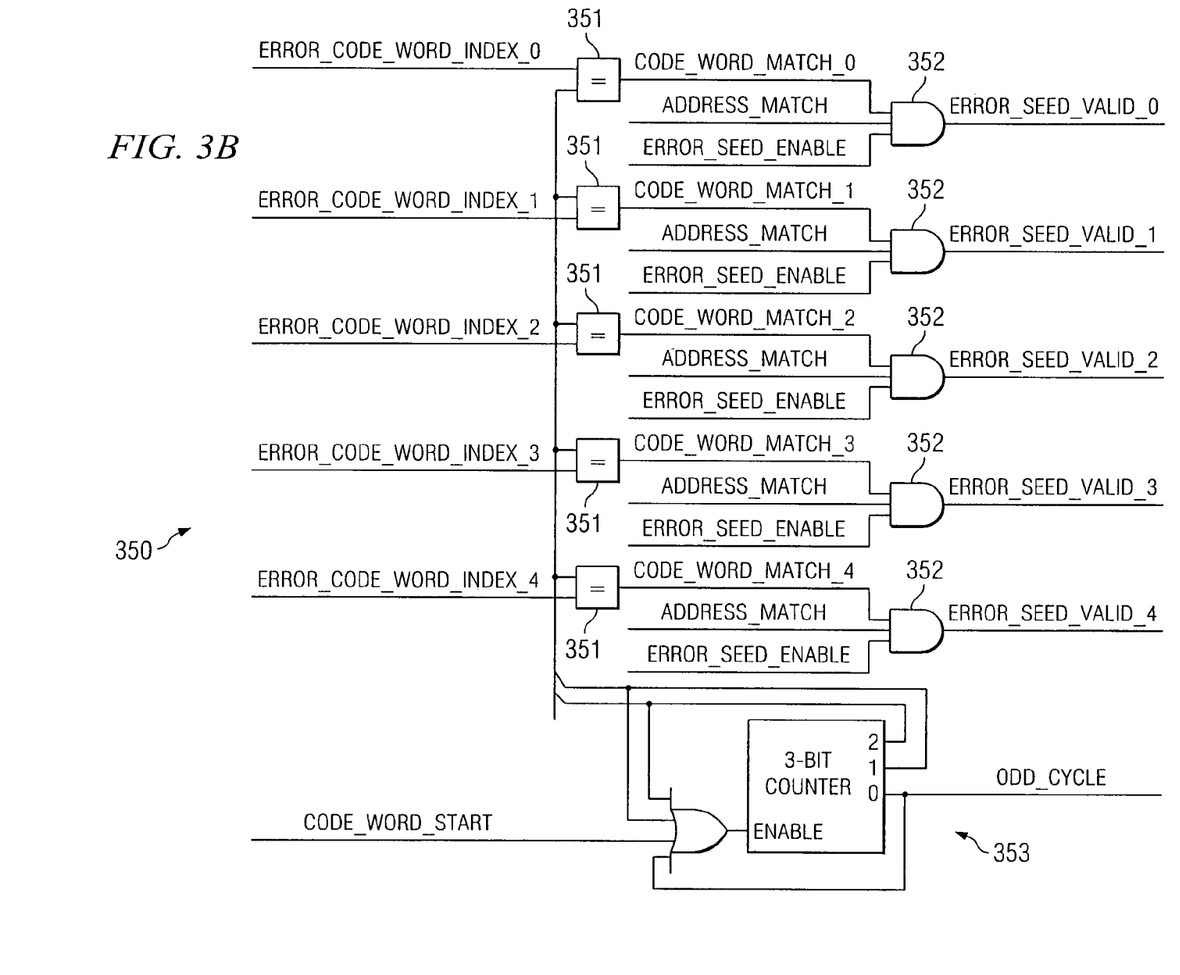
FIG. 3B depicts a logical block for enabling error seeding into identified ECC code words of a set of ECC code words according to representative embodiments.
Figure 3C:
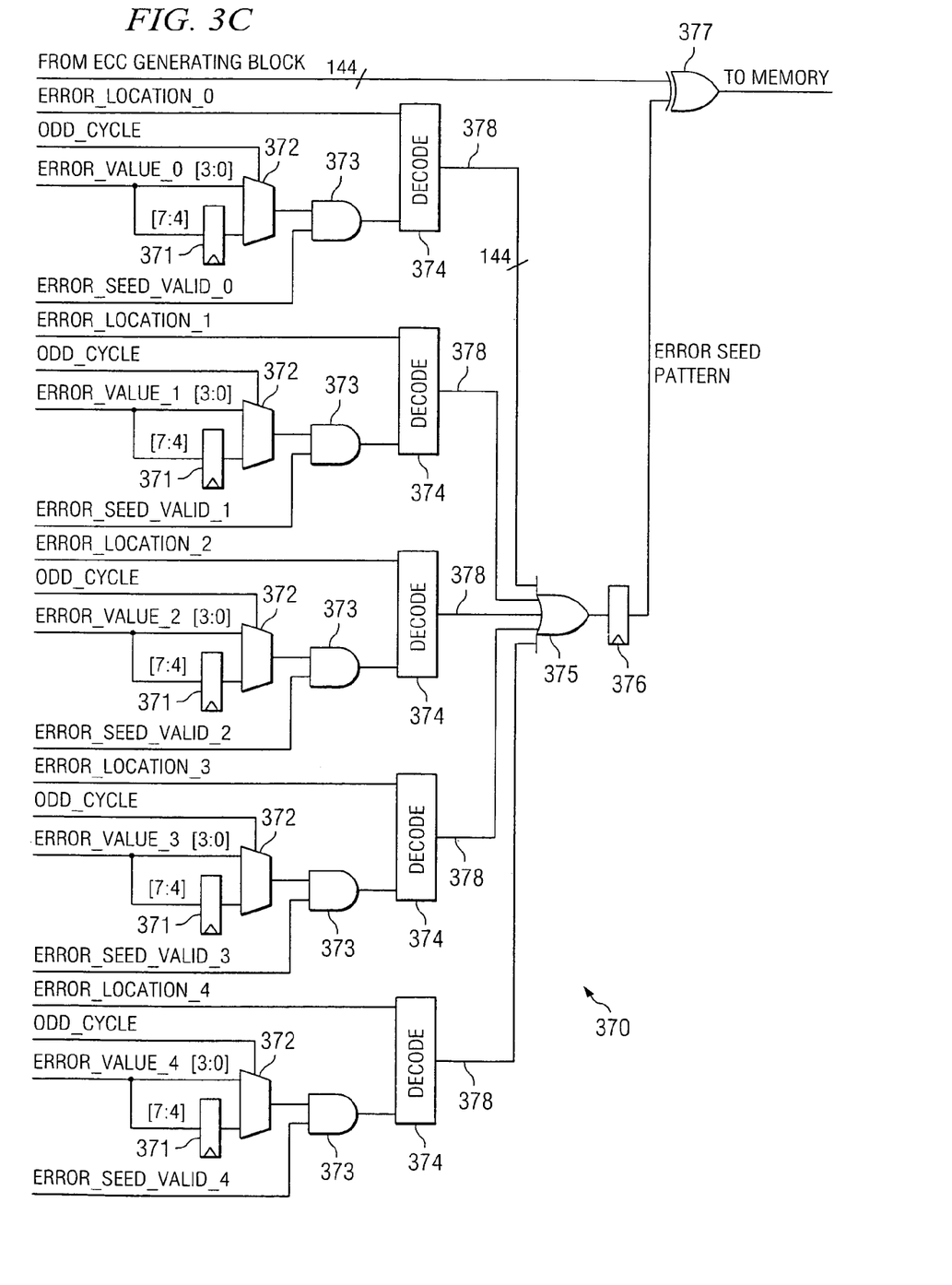
FIG. 3C depicts a logical block for seeding errors into ECC code words in a write path according to representative embodiments.

FIGS. 3A–3C depict functional sub-blocks of write path error seeding block 203 that enable errors to be placed in ECC code words in a controllable manner according to representative embodiments. In representative embodiments, a cache line and associated tag data may be embedded into four ECC code words. Within the four ECC code words of a cache line, selected ones of registers 208 may be set to specify five errors within the four ECC code words. Moreover, the controllable insertion of errors may be isolated to a specific DRAM bus 107, rank 109, bank (a subunit of a rank 109), row, or column. By enabling five errors to be inserted, erasure errors generated by a hardware failure may be emulated. Specifically, four errors may be seeded into each ECC code word of a cache line. Moreover, another single-byte error may be inserted into one of the ECC code words to validate the ability to correct an additional single-byte error.

FIG. 3A depicts address match block 301 that generates "ADDRESS_MATCH" signal to enable errors to be isolated to a specific DRAM bus 107, rank 109, bank (a subunit of a rank 109), row, or column according to representative embodiments. Several input lines of block 301 may be utilized to receive signals according to values loaded into selected ones of registers 208 to facilitate the isolation of errors to specific memory subunits. Specifically, the addresses of errors may be identified using the signals: "ERROR_BUS_ADDRESS," "ERROR_RANK_ADDRESS," "ERROR_BANK_ADDRESS," "ERROR_ROW_ADDRESS," and "ERROR_COL_ADDRESS." The current addresses of data being processed by write path error seeding block 203 are provided to block 301 via the following signals received on other input lines: "BUS_ADDRESS," "RANK_ADDRESS," "BANK_ADDRESS," "ROW_ADDRESS," and "COL_ADDRESS." Suitable address masks may be applied to the current addresses and the error addresses by logical-AND gates 302. After application of the address masks, the current addresses and the error addresses are applied to comparators 303. The outputs of comparators 303 are provided to logical-AND gate 304. If all of the current addresses and their corresponding error addresses match, a logical value of true is generated for the "ADDRESS_MATCH" signal thereby limiting the error seeding as defined by the error addresses.

To facilitate the insertion of five errors into four ECC code words that constitute a cache line, codeword match block 350 may be utilized as shown in FIG. 3B according to representative embodiments. Block 350 may receive the signals "ERROR_CODE_WORD_INDEX_0" through "ERROR_CODE_WORD_INDEX_4" via respective input lines to control which code words of the four ECC code words are to receive errors. These signals may be controlled by values stored in selected ones of registers 208. These signals are provided to respective comparators 351 to compare to the value of the current code word being processed as generated by counter structure 353. Further, the outputs of comparators 351 are provided to respective logical-AND gates 352. Logical-AND gates 352 further receive the "ADDRESS_MATCH" signal and an "ERROR_SEED_ENABLE" signal to control the insertion of errors. As previously discussed, the signal "ADDRESS_MATCH" enables error seeding to be limited to a defined subset of memory system 100. The signal "ERROR_SEED_ENABLE" enables the error seeding to be selectively enabled and disabled. The outputs of logical-AND gates 352 generate the signals "ERROR_SEED_VALID_0" through "ERROR_SEED_VALID_4" to respectively indicate whether the five possible errors should be inserted into the current ECC code word being processed. Counter structure 352 may also generate the signal "ODD_CYCLE" to indicate whether the current bus cycle is an odd cycle.

FIG. 3C depicts error write block 370 that inserts errors into code words according to representative embodiments. As previously noted, the even nibbles of an ECC code word may be communicated during a first bus cycle and the odd nibbles of an ECC code word may be communicated during a second bus cycle. Accordingly, the error patterns (as specified by the signals ERROR_VALUE_0 through ERROR_VALUE_4) may be split into nibbles. Bits [3:0] of a respective error pattern may be applied in a first cycle utilizing multiplexer 372. Bits [7:4] may be buffered in buffer 371 and applied in a second bus cycle utilizing multiplexer 372 when the signal "ODD_CYCLE" is true. The output of multiplexers 372 are provided to respective logical-AND gates 373 along with signals "ERROR_SEED_VALID_0" through "ERROR_SEED_VALID_4." DECODE blocks 374 provide the error patterns received from logical-AND gates 373 to the appropriate portions of buses 378 as defined by signals "ERROR_LOCATIONS_0" through "ERROR_LOCATIONS_4." The error patterns on buses 378 are combined by logical-OR block 375 and communicated through buffer 376. Logical-exclusive-or (XOR) block 377 applies the combined error patterns to 144-bits (i.e., the even nibbles or the odd nibbles) of an ECC code word to be stored in memory.

Figure 4:
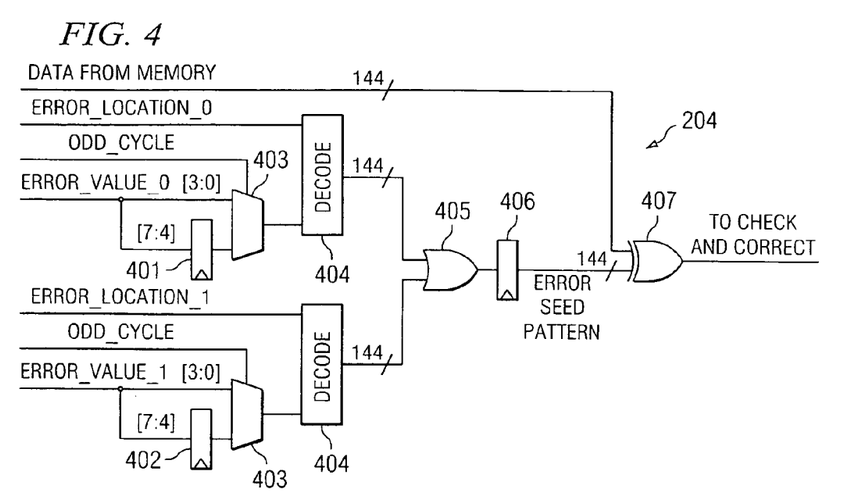
FIG. 4 depicts a logical block for seeding errors into ECC code words in a read path according to representative embodiments.

FIG. 4 depicts read path error seeding block 204 in greater detail according to representative embodiments. Block 204 may insert an error when an ECC code word is retrieved from memory according to representative embodiments. ECC data may be received from memory and an error pattern may be applied to logical-XOR gate 407 to insert the defined errors. The output of XOR-gate 407 is provided to ECC check and correction block 205. Block 204 may be implemented in substantially the same manner as error write block 370. Specifically, buffers 401, multiplexers 403, decode blocks 404, logical-OR gate 405, and buffer 406 may be utilized to generate the error pattern defined by suitable signals controlled by selected ones of registers 208.

Figure 5:
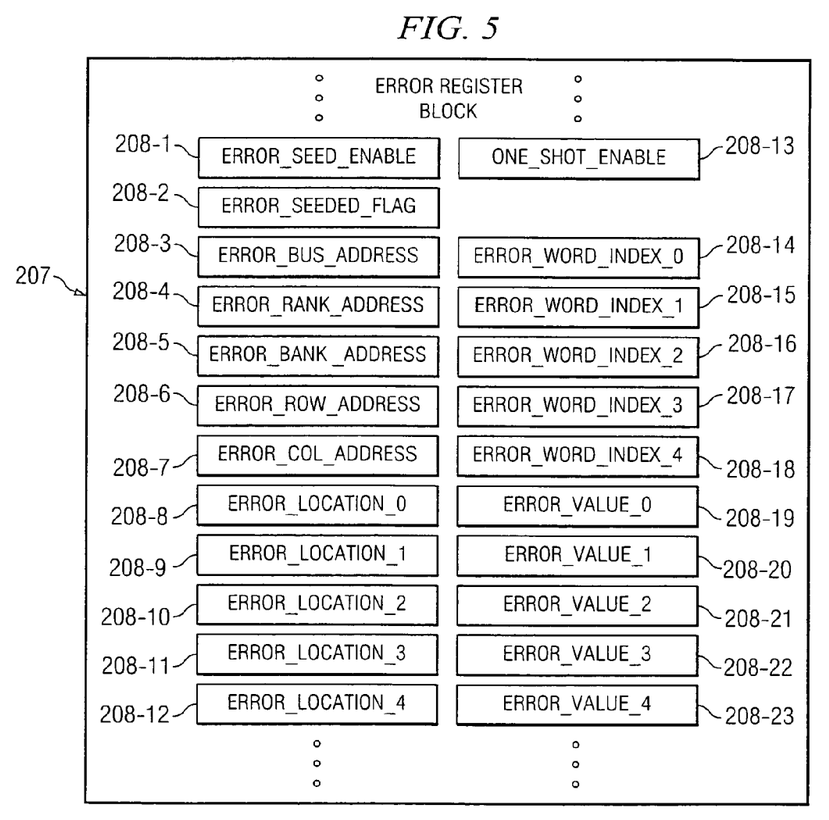
FIG. 5 depicts a register block for controlling error seeding according to representative embodiments.

FIG. 5 depicts register block 207 adapted to control the signals provided to error write block 370 and/or read path error seeding block 204 according to representative embodiments. Register block 207 comprises ERROR_SEED_ENABLE register 208-1 to allow the error seeding to be selectively enabled and disabled. Register block 207 comprises ERROR_SEEDED_FLAG register 208-2 to identify when ECC code words (including inserted errors) of a cache line are written to memory. Register block 207 includes ONE_SHOT_ENABLE register 208-13 to control the number of inserted errors as will be discussed in greater detail below. Register block includes registers 208-3 through 208-7 to limit error seeding to a specific memory rank, bank, row, and/or column. Register block 207 includes registers 208-8 through 208-12 and 208-19 through 208-23 to identify the locations of errors and error patterns for up to five errors. Register block 207 includes register 208-14 through 208-18 to identify the respective ECC code words of a set of code words that constitute a cache line to receive errors.

By providing flexible error seeding functionality as discussed with respect to FIGS. 3A–3C, FIG. 4, and FIG. 5, representative embodiments provide a number of advantages. Representative embodiments enable a more robust ECC algorithm to be validated than is possible with previously known validation mechanisms. Moreover, representative embodiments provide a user substantially greater control over the validation process. By providing the greater amount of control, it makes it possible to emulate the interaction of the implementation of the ECC algorithm with different physical and logical components. Also, representative embodiments may independently validate single-byte correction mode operations of the ECC algorithm and erasure correction mode operations of the ECC algorithm.

Figure 6:
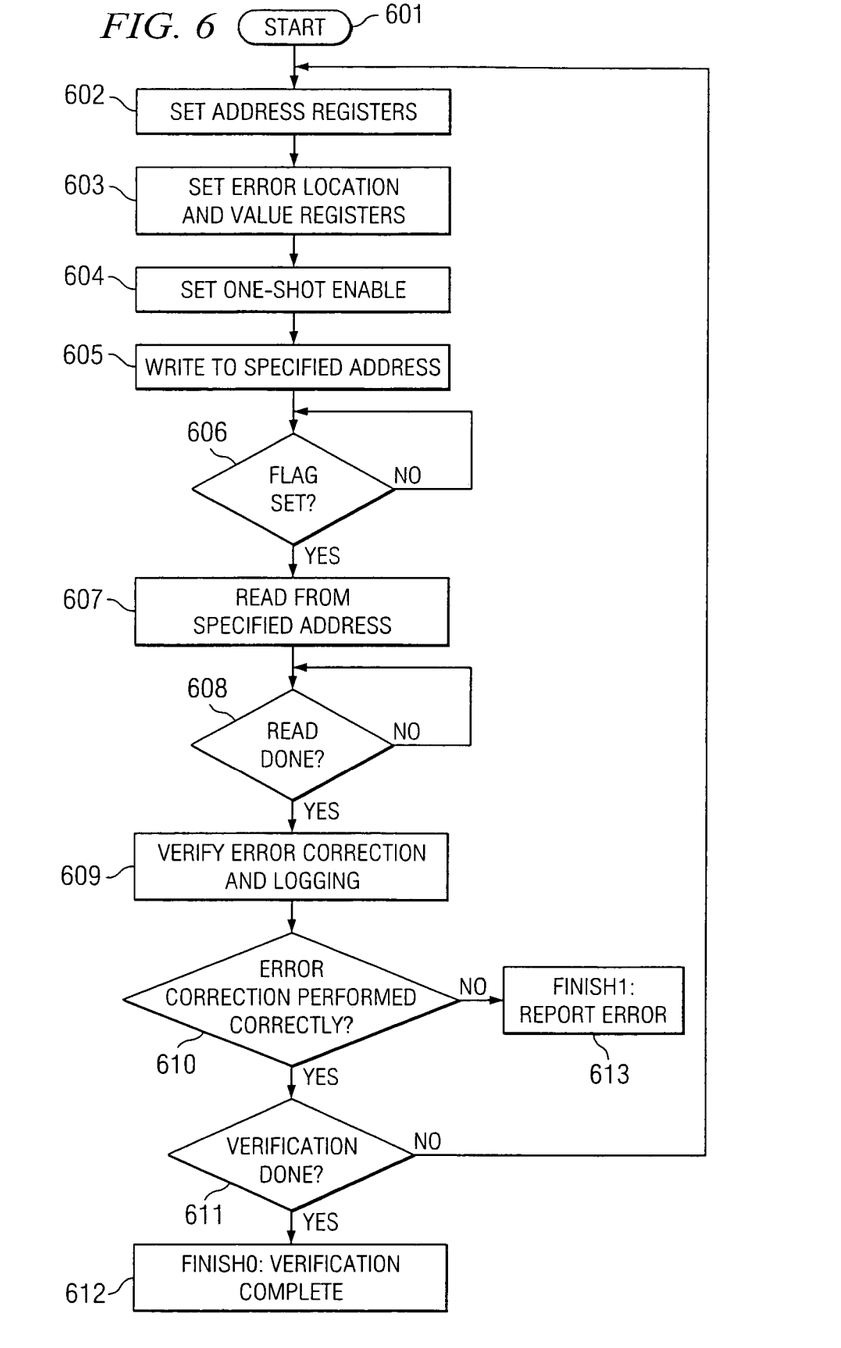
FIG. 6 depicts a flowchart for performing validation of an ECC algorithm according to representative embodiments.

In representative embodiments, a controlled number of errors may be seeded into one or several cache lines utilizing "one-shot" error seeding functionality according to representative embodiments. FIG. 6 depicts a flowchart for seeding errors utilizing "one-shot" functionality according to representative embodiments. In step 601, the error seeding process may begin. In step 602, the address registers may be set with appropriate values to limit error seeding to a specific DRAM bus 107, rank 109, bank (a subunit of a rank 109), row, or column. In step 603, the error location and value registers may be set to suitable values. In step 604, ONE_SHOT_ENABLE register 208-13 is set to a suitable value. By setting register 208-13, error write block 370 will seed only one set of errors as defined by the address registers, the error location registers, and the error value registers. Specifically, errors will be inserted into only one cache line as defined by address registers. In step 605, a write transaction to a specified address may be executed. When the errors are seeded by error write block 370 and the ECC code words are stored in memory, error write block 370 sets ERROR_SEEDED_FLAG register 208-2 to indicate that the affected ECC code words have been stored in memory. A logical comparison is made at step 606 to determine whether the flag has been set to the suitable value. The process flow loops until the flag is set and then proceeds to step 607.

In step 607, a read transaction from the specified address is executed. In step 608, the process flow loops until the read transaction is completed. In step 609, the error correction functionality is verified and the results are logged. In step 610, a logical comparison is made to determine whether the error correction was performed correctly. If the error correction was not performed correctly, the process flow proceeds to step 613 where an error in the error correction is reported. If the error correction was performed correctly, the process flow proceeds to step 611. In step 611, a logical comparison is made to determine whether the verification process is completed. If not, the process flow proceeds to step 602. If it is completed, the process flow proceeds to step 612 where the verification process ends.

By utilizing the "one-shot" enable functionality, representative embodiments further enable the timing of the intentional data corruption to be more easily determined than the timing of intentional data corruption exhibited by known hardware validation mechanisms. Specifically, known hardware validation mechanisms are validated when a processor performs a cache line write. At some point, the cache line is provided to a memory controller to write the cache line to physical memory. Known hardware validation algorithms insert errors into the data after the data is received by the memory controller and before the data is written to physical memory. The timing depends upon a large number of factors related to the caching scheme implemented by the processor and the queuing of packets in the chipset. Thus, it is relatively difficult to ascertain when the error insertion has occurred. In contrast, representative embodiments provide a register to identify exactly when intentionally corrupted write data is written to physical memory. Moreover, representative embodiments further provide a register to control the number of write transactions to be affected. Thus, upon a determination that the write status register is set to a defined value, the specific number of errors in specific portions of memory is known. Thus, the complexity of the validation process is reduced.

What is claimed is:

1. A memory controller, comprising:
   a cache line processing block for processing a cache line into a plurality of segments;
   an error correction code (ECC) generation block that forms ECC code words for each of said plurality of segments for storage in a plurality of memory components;
   an ECC correction block for correcting at least one single-byte erasure error in each erasure corrupted ECC code word retrieved from said plurality of memory components; and
   an error seeding block that enables a respective error to be inserted into each ECC code word of said cache line in response to a plurality of error registers.

2. The memory controller of claim 1 wherein said error seeding block seeds errors in said ECC code words before said ECC code words are written to said plurality of memory components.

3. The memory controller of claim 1 wherein ones of said plurality of error registers define respective error patterns to be inserted into said ECC code words.

4. The memory controller of claim 3 wherein even nibbles of an ECC code word are communicated over a bus during a first bus cycle and odd nibbles are communicated over said bus during a second bus cycle, and wherein said error seeding block comprises a counter structure to control application of even nibbles of said error patterns and odd nibbles of said error patterns.

5. The memory controller of claim 1 further wherein one of said plurality of error registers identifies that only a predetermined number of ECC code words are to be corrupted.

6. The memory controller of claim 5 wherein said an error seeding block sets a flag to indicate that said predetermined number of ECC code words have been corrupted and written to said plurality of memory components.

7. The memory controller of claim 1 wherein said error seeding block inserts at least one error into one of said ECC code words of said cache line into addition to said respective errors in each of said ECC code words.

8. A method for operating a memory controller, comprising:
   processing a cache line into a plurality of segments;
   generating ECC code words for each of said plurality of segments;
   seeding a respective error into each ECC code word of said cache line in response to a plurality of error registers of said memory controller;
   storing said ECC code words in a plurality of memory components;
   retrieving said ECC code words from said plurality of memory components; and
   validating an ECC algorithm by attempting to correct each respective inserted error of said ECC code words as an erasure error.

9. The method of claim 8 wherein said seeding inserts respective errors according to at least one error pattern defined in one of said plurality of error registers.

10. The method of claim 9 wherein even nibbles of an ECC code word are communicated over a bus during a first bus cycle and odd nibbles are communicated over said bus during a second bus cycle, and wherein said seeding includes applying even nibbles of said error pattern during a first cycle of said memory controller and applying odd nibbles of said error pattern during a second cycle of said memory controller.

11. The method of claim 8 wherein said seeding emulates a wire failure within a bus in a communication path between said memory controller and said plurality of memory components in response to at least one of said plurality of error registers.

12. The method of claim 8 wherein said seeding emulates a failure of one of said plurality of memory components in response to at least one of said plurality of error registers.

13. The method of claim 8 further comprising:
   inserting at least one additional error into one of said ECC code words; and
   validating said ECC algorithm by attempting to correct said at least one additional error without specifying to said ECC algorithm a location of said at least one additional error.

14. The method of claim 8 wherein one of said plurality of error registers identifies that only a predetermined number of ECC code words are to be corrupted.

15. The method of claim 14 further comprising:
   setting a flag in said memory controller to indicate that said ECC code words have been written to said plurality of memory components.

16. A memory controller, comprising:
  means for processing a cache line into a plurality of segments;
  means for generating ECC code words for each of said plurality of segments for storage in a plurality of memory components;
  means for correcting at least one single-byte erasure error in each erasure corrupted ECC code word retrieved from said plurality of memory components; and
  means for inserting a respective error into each ECC code word of said cache line in response to a plurality of error registers, wherein said means for inserting is operable before said means for correcting.

17. The memory controller of claim 16 wherein means for inserting is operable before said ECC code words are written to said plurality of memory components.

18. The memory controller of claim 16 wherein said means for inserting retrieves at least one error pattern from said plurality of error registers to define an error pattern to be applied to said ECC code words.

19. The memory controller of claim 18 wherein said means for inserting communicates even nibbles of an ECC code word over a bus during a first bus cycle and odd nibbles over said bus during a second bus cycle, and wherein said means for inserting inserts even nibbles of said error pattern during a first cycle of said memory controller and inserts odd nibbles of said error pattern during a second cycle of said memory controller.

20. The memory controller of claim 16 wherein means for inserting inserts at least one error into one of said ECC code words of said cache line into addition to said respective errors in each of said ECC code words.

* * * * *